US009583277B2

(12) United States Patent
Rich et al.

(10) Patent No.: US 9,583,277 B2
(45) Date of Patent: Feb. 28, 2017

(54) ULTRA-CAPACITOR STRUCTURES AND ELECTRONIC SYSTEMS WITH ULTRA-CAPACITOR STRUCTURES

(71) Applicant: The Paper Battery Company, Inc., Troy, NY (US)

(72) Inventors: Dave Rich, Middleburgh Heights, OH (US); Shreefal Sudhir Mehta, Loudonville, NY (US); Anthony Sudano, Laval (CA); Sudhir Rajaram Kulkarni, Albany, NY (US); Staci Trifilo, Scotia, NY (US)

(73) Assignee: The Paper Battery Company, Inc., Troy, NY (US)

( * ) Notice: Subject to any disclaimer, the term of this patent is extended or adjusted under 35 U.S.C. 154(b) by 229 days.

(21) Appl. No.: 14/485,962

(22) Filed: Sep. 15, 2014

(65) Prior Publication Data
US 2015/0092343 A1 Apr. 2, 2015

Related U.S. Application Data

(60) Provisional application No. 61/884,338, filed on Sep. 30, 2013, provisional application No. 62/031,419, filed on Jul. 31, 2014.

(51) Int. Cl.
*H01G 11/10* (2013.01)
*H05K 5/00* (2006.01)
(Continued)

(52) U.S. Cl.
CPC ............ *H01G 11/10* (2013.01); *H01G 11/82* (2013.01); *H01G 17/00* (2013.01); *Y02E 60/13* (2013.01)

(58) Field of Classification Search
CPC ......... Y02E 60/13; Y02E 10/549; H01G 9/15; H05K 1/162; Y10T 29/417
See application file for complete search history.

(56) References Cited

U.S. PATENT DOCUMENTS 5,587,250 A * 12/1996 Thomas ................... H01G 9/00
429/3
6,252,762 B1 6/2001 Amatucci
(Continued)

FOREIGN PATENT DOCUMENTS

CN 101814773 A 8/2010
CN 102044905 A 5/2011
(Continued)

*Primary Examiner* — Courtney Smith
*Assistant Examiner* — Michael Matey
(74) *Attorney, Agent, or Firm* — Kevin P. Radigan, Esq.; Heslin Rothenberg Farlay & Mesiti P.C.

(57) ABSTRACT

Ultra-capacitor structures and electronic systems and assemblies are provided. In one aspect, the ultra-capacitor structure is configured to selectively power and at least partially house electronic component(s) therein. In one embodiment, the ultra-capacitor structure includes a thermally conductive material facilitating dissipation of heat generated. In another embodiment, the ultra-capacitor structure includes an electrically conductive sheet facilitating electromagnetic shielding. In another aspect, an electronic system includes: an electronic device including electronic component(s); and a support structure physically receiving and electrically coupling to the electronic device, and including an ultra-capacitor structure configured to selectively power the electronic component(s) of the electronic device when electrically coupled to the support structure. In another aspect, an electronic assembly has a first region including electronic component(s), and a second region including an ultra-capacitor structure configured to selectively power the elec- (Continued)

tronic component(s) of the electronic assembly, where the first region is spaced apart from the second region.

21 Claims, 8 Drawing Sheets

(51) Int. Cl.
    *H01G 2/22*       (2006.01)
    *H01G 11/82*     (2013.01)
    *H01G 2/08*       (2006.01)
    *H01G 17/00*     (2006.01)

(56) References Cited

U.S. PATENT DOCUMENTS

| | | | |
|---|---|---|---|
| 6,517,972 B1 | 2/2003 | Amatucci | |
| 7,099,138 B1 | 8/2006 | Togashi et al. | |
| 7,218,489 B2 | 5/2007 | Wilk et al. | |
| 7,388,362 B2 | 6/2008 | Yurgil | |
| 7,554,790 B2 | 6/2009 | James et al. | |
| 7,667,438 B2 | 2/2010 | Ashtiani et al. | |
| 7,701,695 B2 | 4/2010 | Sutardja | |
| 8,134,333 B2 | 3/2012 | Elder et al. | |
| 8,334,017 B2 | 12/2012 | Pushparaj et al. | |
| 8,358,110 B2* | 1/2013 | Rouvala | H01G 11/28 320/166 |
| 8,373,971 B2 | 2/2013 | Young | |
| 8,685,287 B2 | 4/2014 | Worsley et al. | |
| 2008/0010796 A1* | 1/2008 | Pan | H01G 11/36 29/25.03 |
| 2008/0156886 A1* | 7/2008 | Tsuchiya | G06K 19/07749 235/492 |
| 2009/0086409 A1* | 4/2009 | Kang | B82Y 30/00 361/502 |
| 2009/0206657 A1 | 8/2009 | Vuk et al. | |
| 2010/0216023 A1* | 8/2010 | Wei | H01G 9/058 429/220 |
| 2010/0232124 A1* | 9/2010 | Bang | H05K 1/18 361/752 |
| 2011/0013344 A1 | 1/2011 | Remizov et al. | |
| 2012/0139492 A1 | 6/2012 | Kleffel | |
| 2013/0082520 A1* | 4/2013 | Leemans | H01G 4/38 307/9.1 |
| 2013/0107486 A1* | 5/2013 | Hiralal | H01G 11/14 361/782 |
| 2013/0274820 A1* | 10/2013 | Malinowski | A61N 1/36 607/2 |
| 2013/0283847 A1 | 10/2013 | Baumann et al. | |
| 2014/0035098 A1 | 2/2014 | Dunn et al. | |
| 2014/0103857 A1 | 4/2014 | Marten | |
| 2014/0154593 A1 | 6/2014 | Rojeski | |
| 2014/0167515 A1 | 6/2014 | Feuerstack et al. | |
| 2014/0184161 A1 | 7/2014 | Deal et al. | |
| 2014/0265553 A1 | 9/2014 | Mcgee | |
| 2014/0339902 A1 | 11/2014 | Sepe, Jr. et al. | |
| 2015/0024240 A1 | 1/2015 | Seubert et al. | |

FOREIGN PATENT DOCUMENTS

| | | |
|---|---|---|
| CN | 103339787 A | 10/2013 |
| DE | 102013201909 A1 | 8/2014 |
| EP | 1116249 A1 | 7/2001 |
| EP | 1543533 A2 | 6/2005 |
| EP | 2091055 A2 | 8/2009 |
| EP | 2459483 A2 | 6/2012 |
| EP | 2707916 A1 | 3/2014 |
| JP | 07240351 | 9/1995 |
| JP | 11016780 | 1/1999 |
| JP | 2003115423 | 4/2003 |
| JP | 2010232574 | 10/2010 |
| JP | 2012023802 | 2/2012 |
| WO | 2010120813 A2 | 10/2010 |
| WO | 2012021154 A1 | 2/2012 |
| WO | 2012125968 A1 | 9/2012 |

* cited by examiner

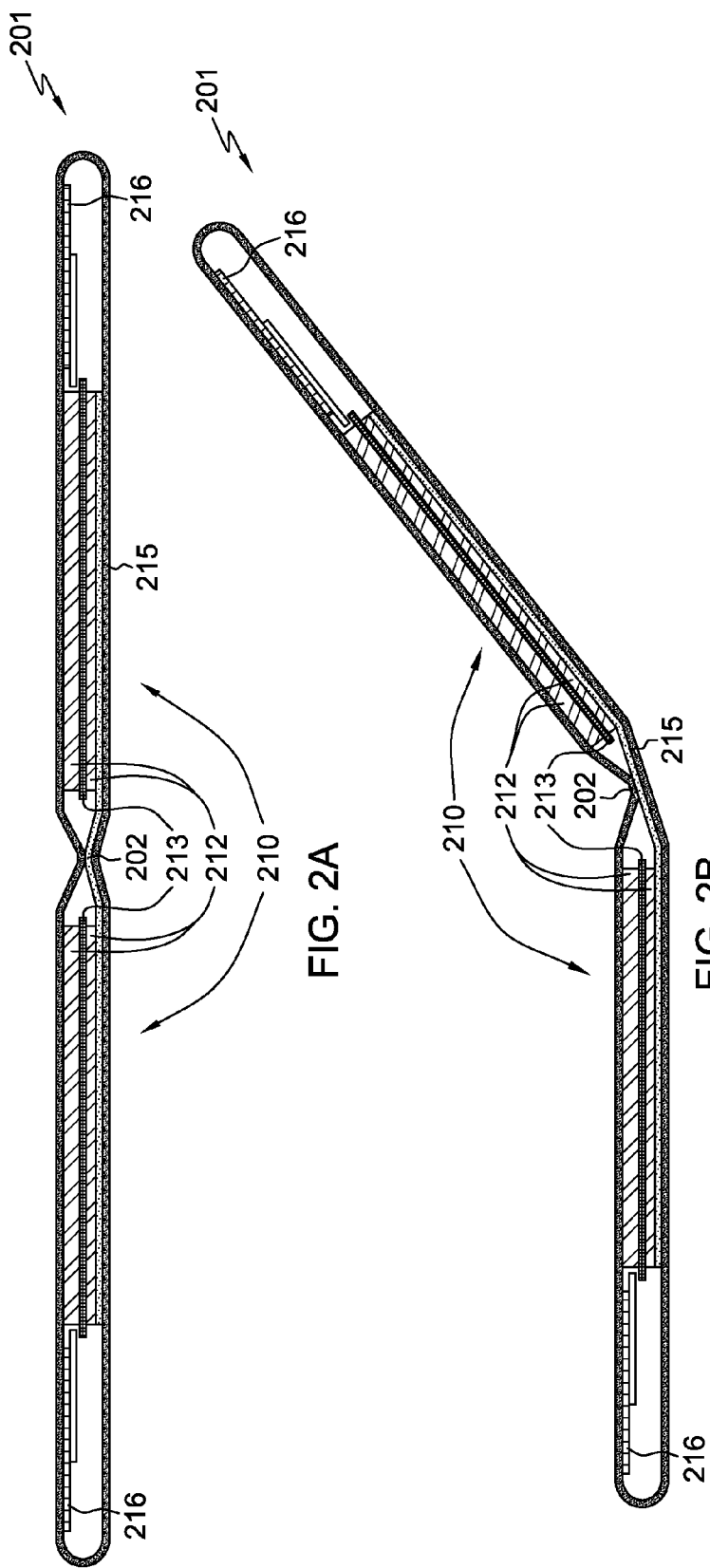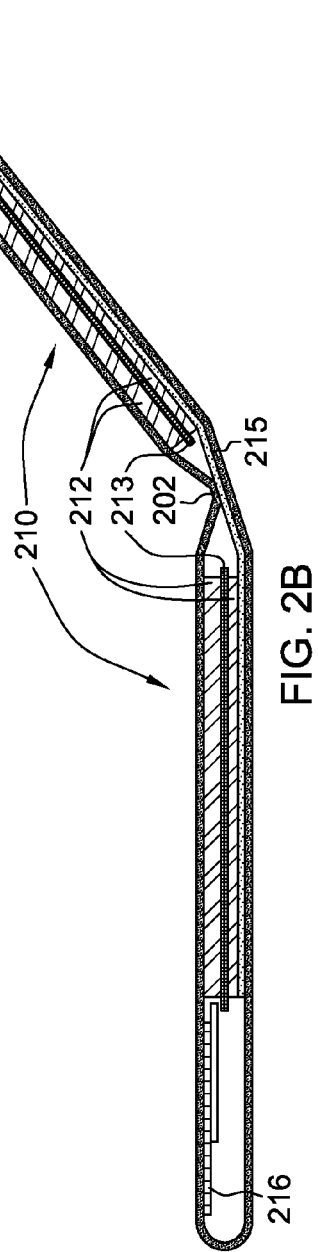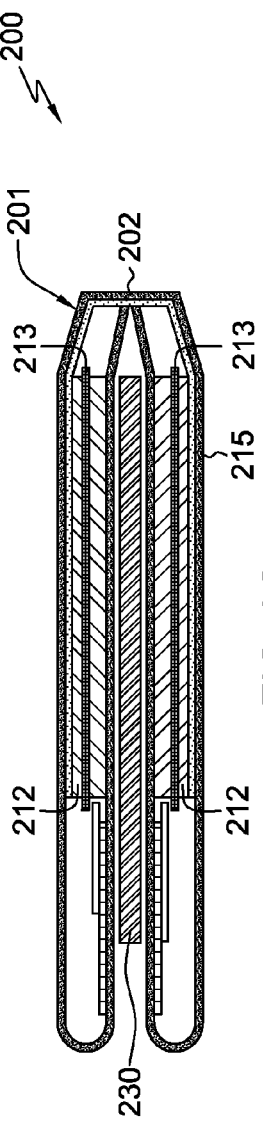

ULTRA-CAPACITOR STRUCTURES AND ELECTRONIC SYSTEMS WITH ULTRA-CAPACITOR STRUCTURES

CROSS-REFERENCE TO RELATED APPLICATIONS

This application claims the benefit of U.S. Provisional Patent Application No. 61/884,338, filed Sep. 30, 2013, which is hereby incorporated herein by reference in its entirety, and this application claims the benefit of U.S. Provisional Patent Application No. 62/031,419, filed Jul. 31, 2014, which is hereby incorporated herein by reference in its entirety.

FIELD OF THE INVENTION

The present invention relates to ultra-capacitor structures and electronic systems with ultra-capacitor structures.

BACKGROUND OF THE INVENTION

One of the key goals of the electronics industry is to reduce the size and weight of electronic devices, such as smart phones, media devices, and portable medical devices, even as functionality requirements, such as power-on time, are increased. A significant portion of the size and weight of electronic devices derives from the use of single purpose materials in the construction of the electronic devices.

BRIEF SUMMARY

The shortcomings of the prior art are overcome, and additional advantages are provided, through the provision, in one aspect, of an ultra-capacitor structure. The ultra-capacitor structure is configured to selectively power and at least partially house one or more electronic components therein.

In another aspect, an electronic system is presented. The electronic system includes one or more electronic components and an ultra-capacitor structure. The ultra-capacitor structure is configured to selectively power and at least partially house the one or more electronic components therein.

In another aspect, an electronic system is presented. The electronic system includes an electronic device and a support structure. The electronic device includes one or more electronic components, and the support structure physically receives and electrically couples to the electronic device, and includes an ultra-capacitor structure, where the ultra-capacitor structure is configured to selectively power the one or more electronic components of the electronic device when electrically coupled to the support structure.

In another aspect, an electronic assembly is presented. The electronic assembly includes a first region and a second region. The first region includes one or more electronic components, and the second region includes an ultra-capacitor structure, the ultra-capacitor structure being configured to selectively power the one or more electronic components of the electronic assembly, where the first region is spaced apart from the second region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2A is a cross-sectional elevational view of one embodiment of an ultra-capacitor structure, in accordance with one or more aspects of the present invention;

FIG. 2B is a cross-sectional elevational view of the ultra-capacitor structure of FIG. 2A bent along a bendable portion thereof, in accordance with one or more aspects of the present invention;

FIG. 2C is a cross-sectional elevational view of one embodiment of an electronic system with the ultra-capacitor structure of FIG. 2A at least partially housing one or more electronic components therein, in accordance with one or more aspects of the present invention;

DETAILED DESCRIPTION

Figure 1:
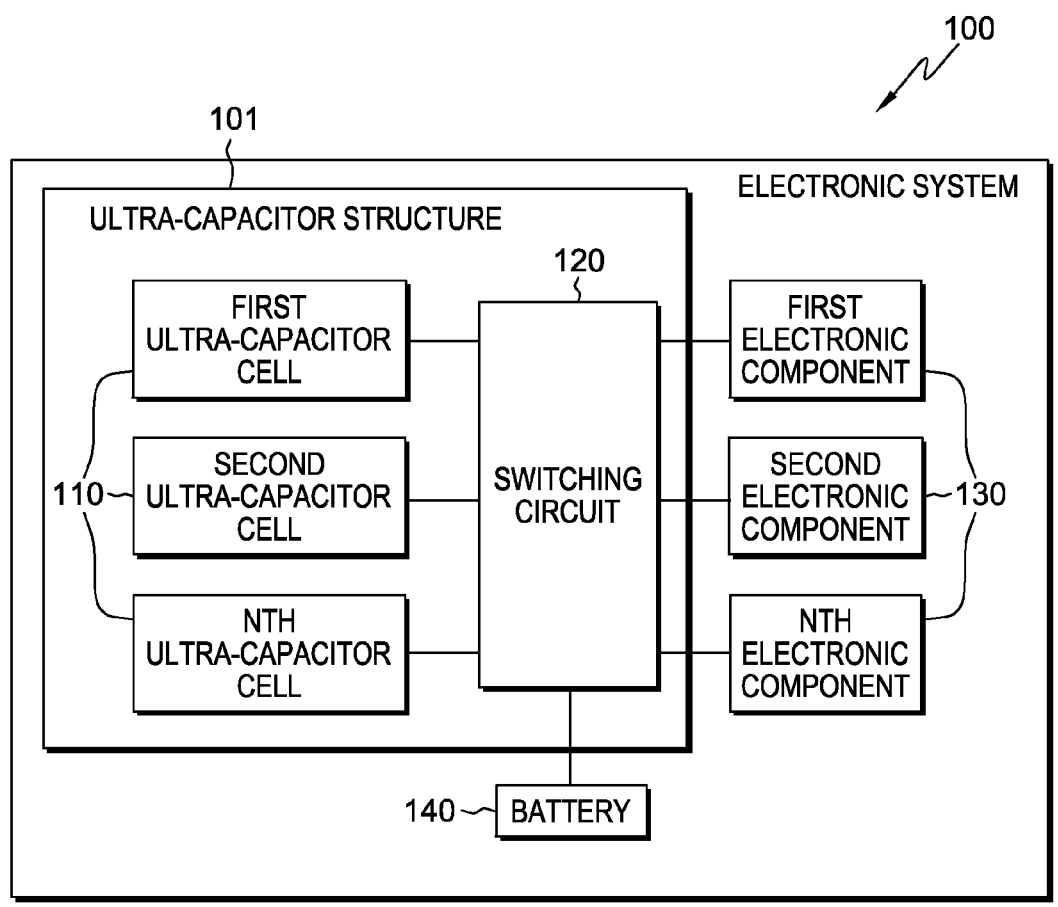
FIG. 1 is a block diagram of one embodiment of an electronic system having one or more electronic components and an ultra-capacitor structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

Consumers continue to demand electronic systems with increased functionality, greater power-on time, and reduced size and weight. A large portion of the size and weight of an electronic system includes materials and structures used for providing non-energy functions, such as structural housing, thermal dissipation, electromagnetic shielding, and other functions.

For instance, housing, such as structural housing, for electronic systems, including mobile devices, is required to protect sensitive electronic components from potentially damaging conditions, such as drops, shocks, liquids, and/or dust, etc. Rugged materials, such as metals, including aluminum, and shock absorbent materials such as plastic and rubber, may be used to ensure that a mobile device remains functional notwithstanding exposure to potentially damaging conditions.

In addition, some electronic components of an electronic system, such as a radio device or microprocessor, may generate more thermal energy than other electronic components. Thermally conductive materials such as metals or graphite (e.g., natural or synthetic) may be used to spread thermal energy away from such heat generating electronic components, in order to avoid overheating, because some electronic components may be sensitive to heat, whether an absolute temperature or temperature gradients.

Further, some electronic components may either generate or be sensitive to electromagnetic radiation. Electrically conductive materials such as metals or enhanced polymers may be used to shield such electronic components to reduce electromagnetic radiation emitting therefrom and/or to reduce electromagnetic radiation impinging thereon from outside sources. For instance, some electronic components generate or transmit and receive radio and other electromagnetic frequency signals.

Advantageously, the present disclosure provides multi-functional ultra-capacitor structures for housing electronic components. The multi-functional ultra-capacitor structures can both selectively power and provide some or all of these non-energy functions to the one or more electronic components of an electronic system. The present disclosure allows for increases in functionality and power-on time with simultaneous decreases in size and weight of electronic systems.

Generally stated, provided herein, in one aspect, is an ultra-capacitor structure. The ultra-capacitor structure is configured to selectively power and at least partially house one or more electronic components therein. In one example, the ultra-capacitor structure includes at least one bendable portion, the at least one bendable portion facilitating the ultra-capacitor structure bending around to at least partially house the one or more electronic components.

In one embodiment, the structure includes a thermally conductive material, the thermally conductive material facilitating dissipation of heat generated by the one or more electronic components at least partially housed within the ultra-capacitor structure. In such a case, the thermally conductive material may include one or more electrodes of the ultra-capacitor structure.

In another embodiment, the structure includes an electrically conductive sheet, the electrically conductive sheet facilitating electromagnetic shielding of the one or more electronic components at least partially housed within the ultra-capacitor structure. In such a case, the electrically conductive sheet may include a current collector of the ultra-capacitor structure. In one example, transmitted electromagnetic or radio frequency interference can be attenuated by the electrically conductive sheet through absorption. In another example, transmitted electromagnetic or radio frequency radiation can be attenuated through reflection.

In a further embodiment, the structure includes a shock absorbent material at least partially surrounding the one or more electronic components housed within the ultra-capacitor structure, the shock absorbent material facilitating impact protection thereof.

In one example, the ultra-capacitor structure includes multiple layers, and the one or more electronic components are positioned between the multiple layers of the ultra-capacitor structure. In another example, the structure includes a printed circuit board having the at least one ultra-capacitor structure, the printed circuit board capable of mechanically supporting and electrically connecting the one or more electronic components. In a further example, the structure further includes a battery, the battery capable of charging the ultra-capacitor structure.

In another aspect, an electronic system is provided. The electronic system includes one or more electronic components and an ultra-capacitor structure. The ultra-capacitor structure is configured to selectively power and at least partially house the one or more electronic components therein. In such a case, in one implementation, the ultra-capacitor structure at least partially forms an outer shell of the electronic system. In another implementation, the electronic system is or includes a mobile device, and the ultra-capacitor structure forms at least a partial outer housing of the mobile device to house the one or more electronic components therein.

In another aspect, an electronic system is presented. The electronic system includes an electronic device and a support structure. The electronic device includes one or more electronic components, and the support structure physically receives and electrically couples to the electronic device, and includes an ultra-capacitor structure, where the ultra-capacitor structure is configured to selectively power the one or more electronic components of the electronic device when electrically coupled to the support structure.

In another aspect, an electronic assembly is presented. The electronic assembly includes a first region and a second region. The first region includes one or more electronic components, and the second region includes an ultra-capacitor structure, the ultra-capacitor structure being configured to selectively power the one or more electronic components of the electronic assembly, where the first region is spaced apart from the second region. In such a case, in one example, the first region is smaller than the second region. In an embodiment, the electronic assembly is an audio headset device, and the second region includes a headband portion thereof, wherein the ultra-capacitor structure includes a curved portion of the headband portion of the audio headset device.

Reference is made below to the drawings, which are not drawn to scale for ease of understanding, wherein the same reference numbers used throughout different figures designate the same or similar components.

FIG. 1 is a block diagram of one embodiment of an electronic system 100 having an ultra-capacitor structure 101, in accordance with one or more aspects of the present invention. As depicted, ultra-capacitor structure 101 includes multiple ultra-capacitor cells 110. As used herein, an ultra-capacitor is, for instance, an electrochemical capacitor that includes an electrolyte disposed between electrodes. An electrolyte is a substance through which electricity may pass, and may be, for example, a fluid, solid, semisolid, or flowable material. One example of an ultra-capacitor is an electrochemical double layer capacitor (EDLC), which may store electrical energy by the separation of charge, for instance, in a double layer of ions, at the interface between the surface of a conductive electrode and an electrolyte. Another term for an ultra-capacitor is a supercapacitor. An ultra-capacitor structure may include one or more ultra-capacitor cells.

Ultra-capacitor structure 101 may be electrically connected, through an optional switching circuit 120, to one or more electronic components 130. Electronic components 130 may be or include, for example, mobile or portable devices, such as mobile phones, media players, headsets, tablet/pad devices, point of sale devices, radios pacemakers, insulin pumps, etc., or may include other devices, such as computers, household appliances (e.g., ovens, coffee makers, rice cookers), tools (e.g., drills, saws), medical devices (e.g., blood pumps, ultra-sound devices), or any other electronic device requiring power.

In the illustrated embodiment, electronic system 100 further includes a battery 140, which is capable of charging ultra-capacitor structure 101, including ultra-capacitor cells 110. In other examples, an ultra-capacitor structure may provided along with other types of energy storage devices, such as a capacitor, a fuel cell, or any other device or structure capable of storing energy. Switching circuit 120 may be used to facilitate electrical connectivity of ultra-capacitor structure 101, ultra-capacitor cells 110, one or more electrical components 130, and battery 140. For example, ultra-capacitor structure 101 may selectively power one or more electronic components 130 through switching circuit 120. In such a case, some ultra-capacitor cells may power one electronic component, concurrently other ultra-capacitor cells may power another electronic component, and concurrently yet other ultra-capacitor cells may be recharged by the battery.

In one embodiment, a switching circuit includes wiring with switching elements, such as transistors or electromechanical relays. In another embodiment, an ultra-capacitor structure may include direct current (DC) to DC conversion circuits, such as switches and other components, to enable specific or configurable arrangements for charging and discharging ultra-capacitor structures of the ultra-capacitor structure from sources or loads, such as batteries and electronic components. In one embodiment, an ultra-capacitor structure may be used to form a battery compartment, and may include connectors and a battery compartment floor. In another embodiment, ultra-capacitor cells of an ultra-capacitor structure may share a common electrolyte, including sharing the electrolyte with one or more batteries.

Energy storage devices, including ultra-capacitor structures and batteries, may be characterized by an energy density and a power density. The energy density (also known as the specific energy) of an energy storage device is defined as the amount of energy stored per unit mass of the device, and the power density is defined as the rate per unit mass at which energy may be transferred to or from the device. Different types of energy storage devices may be compared by comparing their respective energy densities and power densities. As one example, an activated carbon ultra-capacitor may have, for example one-tenth of the energy density of a conventional lithium-ion rechargeable battery, but have, for example, 10 to 100 times the power density of the conventional lithium-ion rechargeable battery. Therefore, an ultra-capacitor may deliver a relatively large amount of energy to an electrical load over a relatively short time, as compared to a battery that may deliver a relatively small amount of energy to an electrical load over a relatively long time.

In operation, an electronic system or assembly may use multiple types of energy storage devices. This is because different electronic components may have different operating requirements for voltage, current, power, energy, and/or RC (resistance times capacitance) time constants. For instance, certain components, such as a central processing unit, a memory storage device, or a display screen may steadily consume power. In addition, other components, such as radio transceiver, a camera flash, or a pump portion of a medical device, such as an insulin pump, may intermittently consume high power for short durations. In such a case, a battery may be used for long term storage of energy, and may be used to charge one or more ultra-capacitor cells of an ultra-capacitor structure, which may then deliver bursts of higher levels of energy at appropriate voltage, current, power, and/or RC time constant, as needed by various electronic components.

FIG. 2A is a cross-sectional elevational view of one embodiment of an ultra-capacitor structure 201 including at least one ultra-capacitor cell 210, in accordance with one or more aspects of the present invention. In the illustrated embodiment, ultra-capacitor structure 201 includes two ultra-capacitor cells 210 which come together at a bendable portion 202.

As depicted, each ultra-capacitor cell includes electrodes 212 separated by a separator 213, and electrically connected by ions of an electrolyte located between electrodes 212. Electrodes 212 may be fabricated of a porous or spongy material, which may have a large specific surface area (such as activated carbon, amorphous carbon, carbon aerogel, graphene, or carbon nanotubes), for instance, a specific surface area of 500-1000 square meters per gram, due to micro-porosity, and the electrolyte may include a solvent with dissolved chemicals, such as potassium hydroxide (KOH). Electrodes 212 are connected to one or more current collectors 215, which may include a conductive material, such as a metal, for instance, aluminum or copper. For example, the electrode material, such as graphite, may be painted onto the current collectors. Current collectors 215 may act as terminals, such as positively charged anodes or negatively charged cathodes of ultra-capacitor cells 210. The terminals may be accessed by conductive contact tabs 216.

In the illustrated embodiment, two ultra-capacitor cells 210 are connected in series in a "2s" configuration. In one example, if each ultra-capacitor cell has a voltage capacity of 2.7 volts (V), in the 2s configuration, 5.4 V may be delivered to an electrical load. In another example, the construction may be such that a 2s configuration is within an integrated package sharing some common materials, including outer packaging material. In a further example, the ultra-capacitor structure, which may be predominantly flat, has extremely low internal impedance. Various materials may be used in the formation of an ultra-capacitor structure. For example, polymers, such as polyethylene terephthalate (PET), may be used to provide electrical insulation or to contain electrolytes, and adhesives may be used to bond layers together.

FIG. 2B is a cross-sectional elevational view of ultra-capacitor structure 201 bent along bendable portion 202, in accordance with one or more aspects of the present invention. As illustrated, ultra-capacitor structure 201 has been bent at an angle along bendable portion 202. In three-dimensions, bendable portion 202 may be a line. A bendable portion may be patterned into an ultra-capacitor structure by techniques and build processes for making hermetic seals along such bend lines. In such a case, the hermetic seals may serve the dual purpose of forming a bendable portion and providing electrical isolation between ultra-capacitor structures.

FIG. 2C is a cross-sectional elevational view of one embodiment of an electronic system 200 with ultra-capacitor structure 201 at least partially housing one or more electronic components 230, in accordance with one or more aspects of the present invention. As illustrated, ultra-capacitor structure 201 at least partially houses electronic component 230, in this example, by bending around to at least partially surround electronic component 230. By bending around and at least partially surrounding the electronic component(s), the ultra-capacitor structure houses the electronic component(s) and may provide structural, thermal, and/or electromagnetic functionality for the electronic component(s). For instance, in the illustrated example, bendable portion 202 has allowed for a 180° bend in ultra-capacitor structure 201, at least partially housing electronic component 230. In one example, the bendable portion can remain flexible after manufacturing, allowing reconfiguration of the bend angle. In another example, after manufacturing, an ultra-capacitor structure may be fixed in place.

In one embodiment, the bend lines can then allow maximum flexibility to fit into cramped environments such as around components, and still maintain device integrity and functionality. For instance, the ultra-capacitor structure may be a single device with multiple ultra-capacitor cells configured in parallel or series, and each ultra-capacitor cell may be separated from the others with a bendable portion, allowing for many folding options. In such a case, bend or fold lines may be between ultra-capacitor cells, or may be through ultra-capacitor cells. Bend lines may also be used to house electronic components, provide connections to power rails, or provide control and data signals to or from other electronic components.

In another embodiment, the bendable portions may also contain outlets or vents for release of gas from an electrolyte receiving chamber of an ultra-capacitor cell. In a further embodiment, bendable portions may also contain integrated circuits or chips for balancing or voltage adjustments of the attached devices.

In a further embodiment, an ultra-capacitor structure may include other materials, components, and/or layers for the purposes of providing protection from surrounding environmental conditions. For example, the ultra-capacitor structure may be sealed around one or more electronic components, to protect them from humidity or reducing and/or oxidizing agents. In a further embodiment, an ultra-capacitor structure may protect one or more electronic components from excessive forces, such as mechanical forces due to vibration, bending, flexing, or twisting. In such a case, the ultra-capacitor structure may include foams, polymers, plastics, metals, ceramics, or ceramic metals.

Figure 3A:
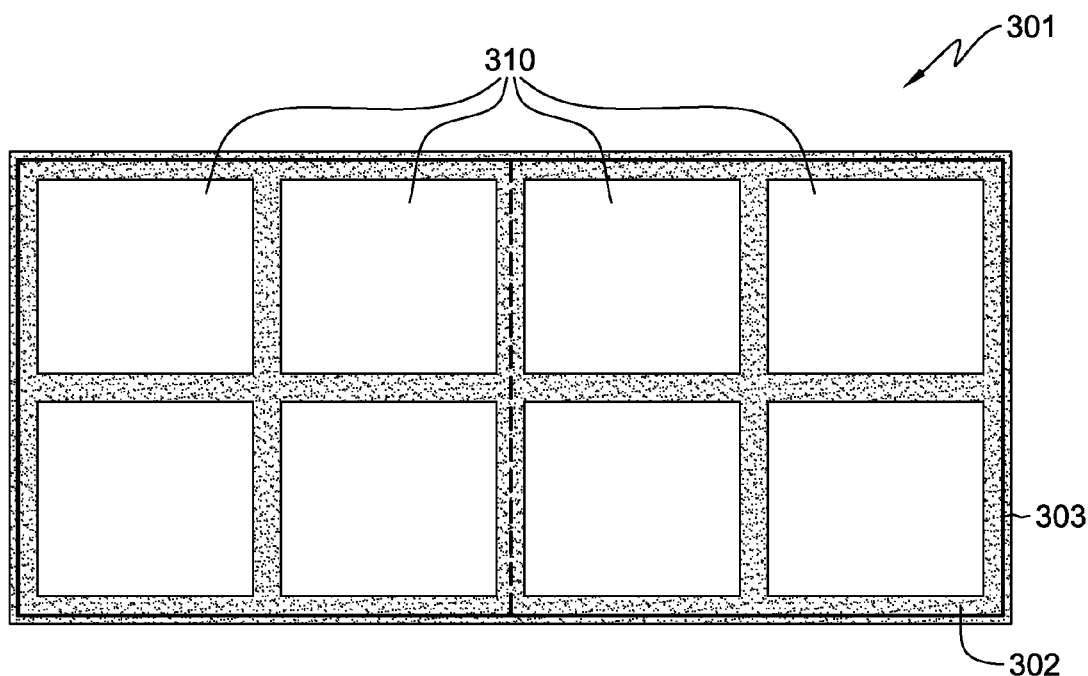
FIG. 3A depicts one embodiment of an ultra-capacitor structure having multiple ultra-capacitor cells and a shock absorbent material, in accordance with one or more aspects of the present invention.

FIG. 3A depicts one embodiment of an ultra-capacitor structure 301 having multiple ultra-capacitor cells 310 and a shock absorbent material 302, in accordance with one or more aspects of the present invention. In the illustrated embodiment, ultra-capacitor structure 301 includes eight ultra-capacitor cells 310 and a border 303.

For instance, ultra-capacitor structure 301 may be placed with one or more electronic components of a smart phone in order to at least partially house and protect the electronic components. In one example, border 303 may be a shock absorbent adhesive and/or waterproofing layer, connecting to the bezel around a smart phone (see, for example, FIG. 9).

In such an example, if the smart phone were to drop to the ground, hitting the bezel, shock absorbent material 302 and border 303 can dissipate the energy of such an impact, thereby protecting the sensitive electronic components of the smart phone housed within ultra-capacitor structure 301. In another example, such electronic components may be located directly beneath, above, or alongside one or more ultra-capacitor cells 310. In a further example, an ultra-capacitor structure may include a plurality of the structures depicted in FIG. 3A, assembled as a stack with electronic components in between the stacked layers. In such a case, border 303 may extend along the edges of and/or through all the stacked structures to form a shock absorbent border around the entire stack, and a bezel may then adhere to the border, thereby protecting the electronic components within the stacked structure from damage due to drops or other impacts. In one embodiment, an ultra-capacitor structure can include a mechanical shock absorbing electrode material.

Figure 3B:
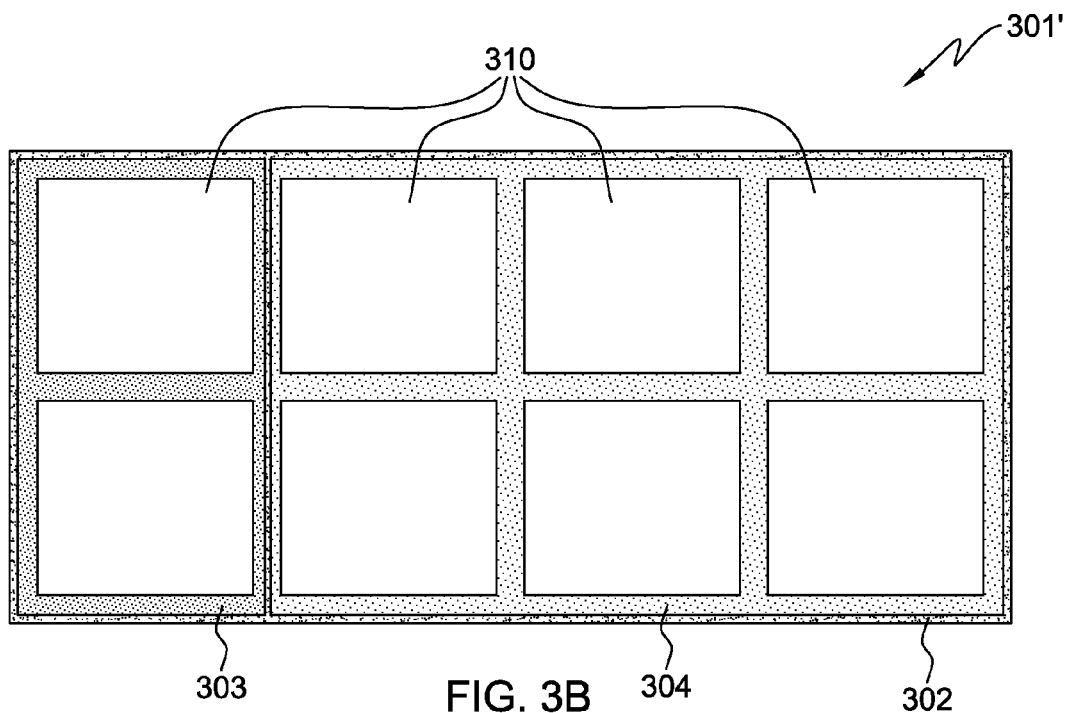
FIG. 3B depicts one embodiment of an ultra-capacitor structure having multiple ultra-capacitor cells and an electrically conductive sheet(s), in accordance with one or more aspects of the present invention.

FIG. 3B is a plan view of one embodiment of an ultra-capacitor structure 301' having eight ultra-capacitor cells 310 and electrically conductive sheets 303-304, in accordance with one or more aspects of the present invention. In the illustrated embodiment, electrically conductive sheets 303-304, facilitates electromagnetic shielding of one or more electronic components located or placed with ultra-capacitor structure 301'. Each electrically conductive sheet may be any electrically conductive material, such as aluminum, steel, or copper, or materials chosen for their magnetic permeability, such as mu-metals. In one example, an electrically conductive sheet may be one or more current collectors ultra-capacitor cells 310. For instance, electrically conducting sheet 303 may be a shared current collector for two ultra-capacitor cells 310 located on the left side of FIG. 3B, and electrically conducting sheet 304 may be a shared current collector for six ultra-capacitor cells 310 located on the right side of FIG. 3B. In another example, the electrically conducting sheets may be separate structures.

Electromagnetic interference, such as radio-frequency interference, may be externally originating or internally originating. Electromagnetic interference is a disturbance, which when left unsuppressed, may affect performance of one or more electronic components. As one example, electromagnetic interference may interfere with the function of an audio circuit in a smart phone, degrading the quality of the audio signal. Common external sources which may initiate electromagnetic interference include televisions, computer monitors, cordless telephones, microwave ovens, wireless hot-spots, etc., and internally originating electromagnetic interference may originate, for example, in a mobile radio subsystem communicating with, for example, a mobile phone tower.

Advantageously, the illustrated configuration makes multi-function use of the current collectors of the ultra-capacitor structures to suppress electromagnetic interference. For example, some electronic components may be placed behind electrically conducting sheet 303 and other electronic components may be placed behind electrically conducting sheet 304. Such a configuration facilitates electromagnetic shielding of electromagnetic interference generated by, and electromagnetic interference generated towards, the two groups of components. In such a manner, individual electronic components may be shielded from one another, and/or shielded from outside electromagnetic fields. In one embodiment, an ultra-capacitor structure can provide electromagnetic shielding for multiple transmitters and multiple receivers. For instance, the ultra-capacitor structure may include electrical discontinuities (for example, by being at least partially isolated with electrical insulation from one another), so that different portions of the ultra-capacitor structure (which may include different ultra-capacitors) are electrically isolated, and may thus eliminate electrical connections between the multiple transmitters and receivers. Such an example can be used to separate multiple sources of EMI, such as central processing units, radio frequency circuits, or high-speed digital circuits.

Electromagnetic interference may include radiated, transmitted, or coupled interference, light, and coupled electric & magnetic fields. Sources of such radiation include inductive (near-field or far-field), resonant, or wireless chargers and/or motors, ground loops, offset alternating current and/or direct current noise, including ripple and droop. In addition, electromagnetic interference may be generated by the ultra-capacitor structure, including the ultra-capacitor cells, or the one or more electronic components, due to high or time-shifted pulses, such as those around tabs, connectors, or electrodes of the ultra-capacitor structure.

Figure 4:
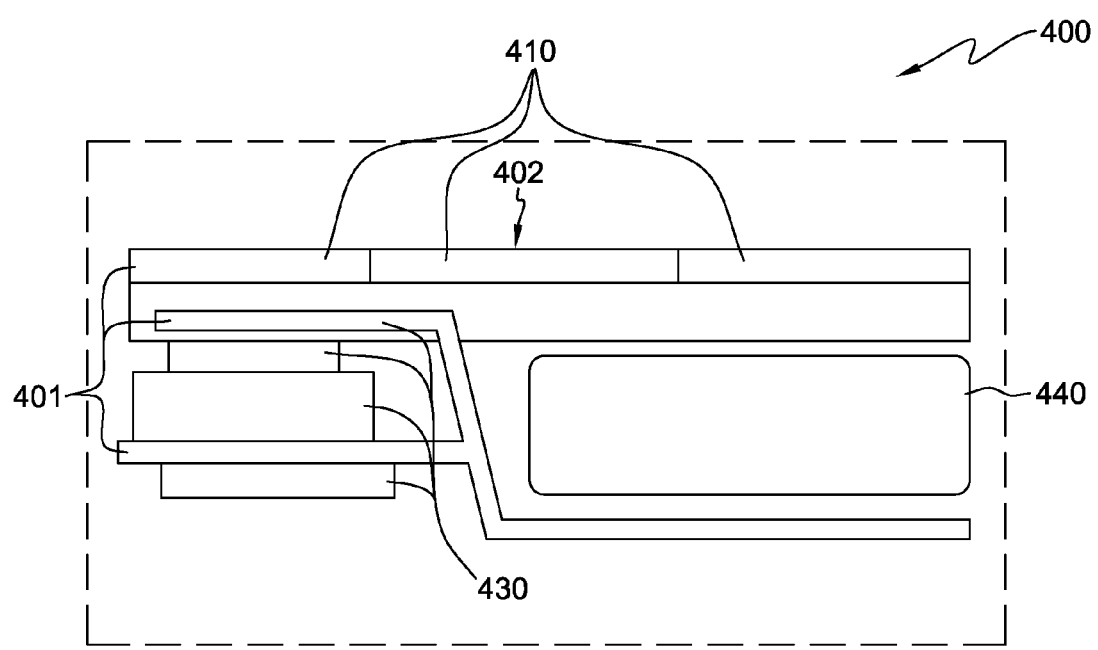
FIG. 4 is a cross-sectional elevational view of one embodiment of an electronic system having one or more electronic components and an ultra-capacitor structure, in accordance with one or more aspects of the present invention.

FIG. 4 is a cross-sectional elevational view of one embodiment of an electronic system 400 having one or more electronic components 430 and an ultra-capacitor structure 401, in accordance with one or more aspects of the present invention. As illustrated, ultra-capacitor structure 401 is a multi-functional device, capable of at least partially housing one or more electronic components 430, and facilitating dissipation of heat and/or electromagnetic shielding thereof.

For instance, in the illustrated embodiment, ultra-capacitor structure 401 includes a thermally conductive material 402, which facilitates dissipation of heat generated by one or more electronic components 430. Thermally conductive material 402 may be any thermally conductive material, such as aluminum or magnesium, or may be or include graphite. In one embodiment, thermally conductive material 402 may be one or more electrodes of one or more ultra-capacitor cells 410 of ultra-capacitor structure 401.

Advantageously, such a configuration makes multi-function use of the electrodes of the ultra-capacitor structures because graphite material may be used as an electrode of an ultra-capacitor structure. Because the material is already present within an ultra-capacitor, an ultra-capacitor structure include such an ultra-capacitor structure may be configured to at least partially house one or more electronic components. As illustrated, electronic components 430 are at least partially housed within ultra-capacitor structure 401. In one example, any heat generated by the electronic components or other sources may be spread by the ultra-capacitor structure, so that no specific electronic component or portion of the electronic system overheats. In another example, an additional material layer, such as natural or synthetic graphite, may be added within the pouch containing multiple ultra-capacitor cells of an ultra-capacitor structure for the purpose of spreading or dissipating heat.

In one example, the ultra-capacitor structure may be designed to shield, dissipate, or modulate heat in a specific manner, to control the rate, quantity, or direction of heat in three-dimensions within an electronic system. In another example, thermal interface management may be achieved using layers of materials to either thermally connect or thermally isolate an ultra-capacitor structure from surfaces or edges of other components, which may be located at different positions or levels of an electronic system, in a stacked arrangement. In such a case, internal temperatures may be significantly reduced, without causing a surface hotspot. In a further example, an ultra-capacitor structure may include thermal sensing or measuring functions to communicate thermal conditions to one or more electronic components. In a further example, heat sensitive electronic components, which may have a sheet-like profile, may be stacked vertically in order to optimize space usage. In such a case, an ultra-capacitor structure may be interleaved with the stack of electronic components to facilitate thermal protection, dissipation, or spreading.

In another example, the thermally conductive material may include current collectors or pouching materials of the ultra-capacitor structure. Thermal dissipation can include various aspects of thermal engineering, including, for example, shielding from heat to limit the transferred heat density between physically coupled or uncoupled layers, or redirecting heat flow onto a preferential path. For example, in a case where an ultra-capacitor structure is placed between a heat source and heat sensitive components, a thermally conductive portion, such as a thermally conductive electrode of the ultra-capacitor structure, can be placed proximal to the heat source, and a thermally shielding portion of the ultra-capacitor structure, such as a thermally shielding electrode, can be placed proximal to the heat sensitive component. In a further example, in one embodiment, an ultra-capacitor structure can include a stack of multiple ultra-capacitor cells, multiple thermally conductive portions and multiple thermally shielding portions, the multiple thermally conductive portions being placed proximal to multiple heat generating electronic components and the multiple thermally shielding portions being placed proximal to multiple heat sensitive electronic components.

Sources of heat may include, for example, a hot central processing unit, an internal combustion engine of a hybrid-electric vehicle powered by the ultra-capacitor structure, a compressor in a heating, ventilation or air-conditioning system, or environmental conditions.

Further, as illustrated, ultra-capacitor structure 401 includes multiple layers, and one or more electronic components 430 may be positioned between the multiple layers. Such a configuration may facilitate some or all of thermal dissipation, shock absorption and/or electromagnetic shielding of the electronic system. In addition, the ultra-capacitor structure can include a printed circuit board having at least one ultra-capacitor therein. In such a case, the printed circuit board is capable of mechanically supporting and electrically connecting one or more electronic components 430. In one embodiment, the printed circuit board may be flexible, with a fixed degree of flexibility. As illustrated, for example, components may be mounted to one or either side of the ultra-capacitor structure, including a printed circuit board thereof, using, for example, surface mounting techniques.

In addition, the ultra-capacitor structure could include a shock absorbent material, such as a polymer (e.g., PET) at least partially surrounding the one or more electronic components at least partially housed within the ultra-capacitor structure. The shock absorbent material, which facilitates impact protection of the one or more electronic components, may include foam, and may also regulate compression or swelling of the one or more electronic components. Further, the construction of one or more ultra-capacitor structures may include electrolytes contained in an electrolyte receiving chamber, which may be used as a shock absorbent material, because typically an electrolyte receiving chamber is designed to be resilient to expanding gases caused during operation.

FIG. 5-11B are embodiments of electronic systems, including mobile devices, having one or more electronic components and an ultra-capacitor structure, in accordance with one or more aspects of the present invention. These embodiments illustrate some of the many ways in which multi-functional ultra-capacitor structures may be used in the construction of electronic systems. In one embodiment, the ultra-capacitor structure can include multiple ultra-capacitor cells, wrapped around one another in a pack or stacked configuration.

Figure 5:
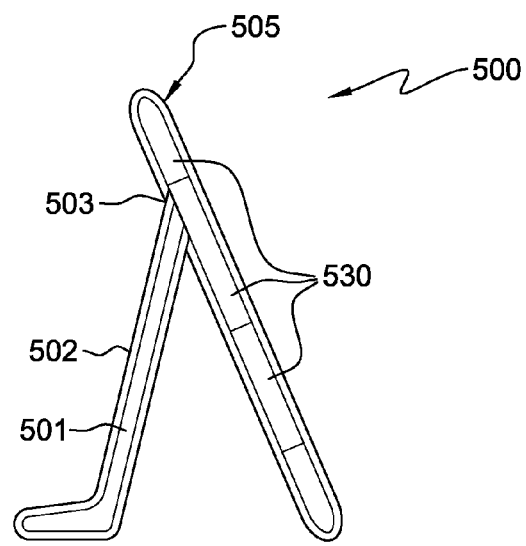
FIG. 5 illustrates a tablet style electronic system, in accordance with one or more aspects of the present invention.

FIG. 5 illustrates a tablet style electronic system 500 having an electronic device 505 and a support structure 502, in accordance with one or more aspects of the present invention. Electronic device 505 includes one or more electronic components 530, and may be, for example, a tablet style device. Support structure 502 physically receives and electrically couples to electronic device 505 at interface 503.

Support structure 502 also includes an ultra-capacitor structure 501. Ultra-capacitor structure 501 is configured to selectively power one or more electronic components 530 of electronic device 505, when electrically coupled to support structure 502. As illustrated, the support structure is a kickstand for the electronic device.

In one implementation ultra-capacitor structure 501 may include a bendable portion. Advantageously, a bendable portion of ultra-capacitor structure 501 can facilitate bending of support structure 501, so that it may be used as a kickstand in the open or closed position. In one embodiment, an ultra-capacitor structure may be located within the kickstand only, with a connection to the tablet portion, allowing manufacturing of a base tablet portion. Such a configuration may allow the ultra-capacitor structure to be used as an add-on when the kickstand is used, improving thermal and power-on time performance of the system. In another embodiment, the ultra-capacitor structure may be included within both the kickstand and the tablet portion.

Figure 6:
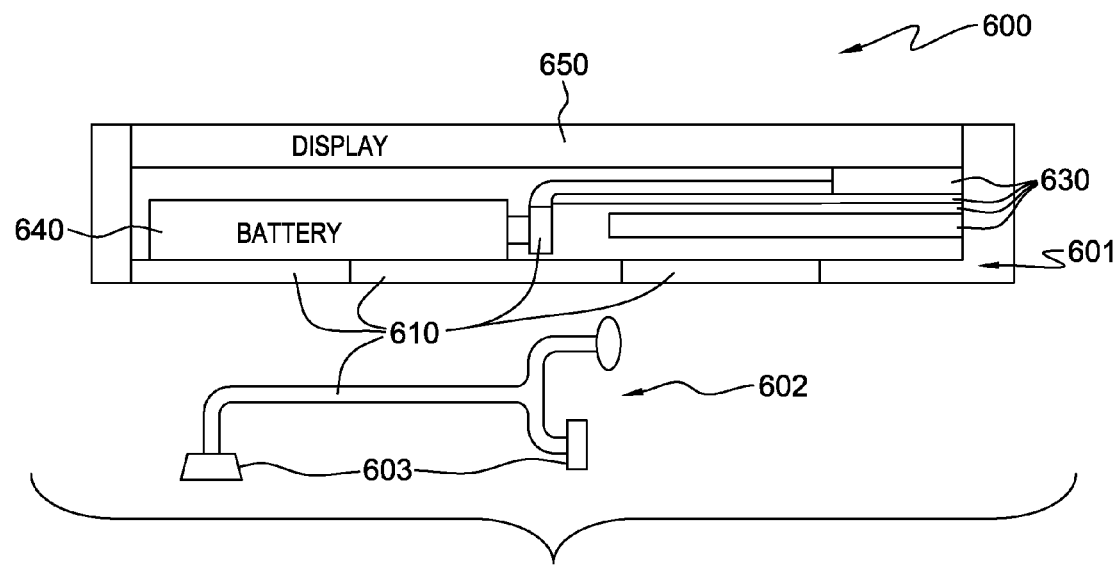
FIG. 6 illustrates a mobile device type electronic system, in accordance with one or more aspects of the present invention.

FIG. 6 illustrates a mobile device type electronic system 600 having an ultra-capacitor structure 601 and a display device 650, in accordance with one or more aspects of the present invention. As illustrated, ultra-capacitor structure 601 at least partially houses display device 650, a battery 640, and other electronic components 630. Ultra-capacitor structure 601 includes a ribbon cable portion 602, which may be inserted into the main body of electronic system 600 and may connect one or more electronic components 630. For example, display device 650 may be connected to a printed circuit board portion of ultra-capacitor structure 601. In the illustrated embodiment, mobile device type electronic system 600 is at least partially housed within ultra-capacitor structure 601, which provides multiple functions, such as mechanical stability, shock absorption, electromagnetic shielding, and thermal shielding.

In another example, an ultra-capacitor structure may provide the interface for electrical and/or mechanical connections between one or more electronic components, for example, providing a lamppost for light emitting diodes.

Figure 7:
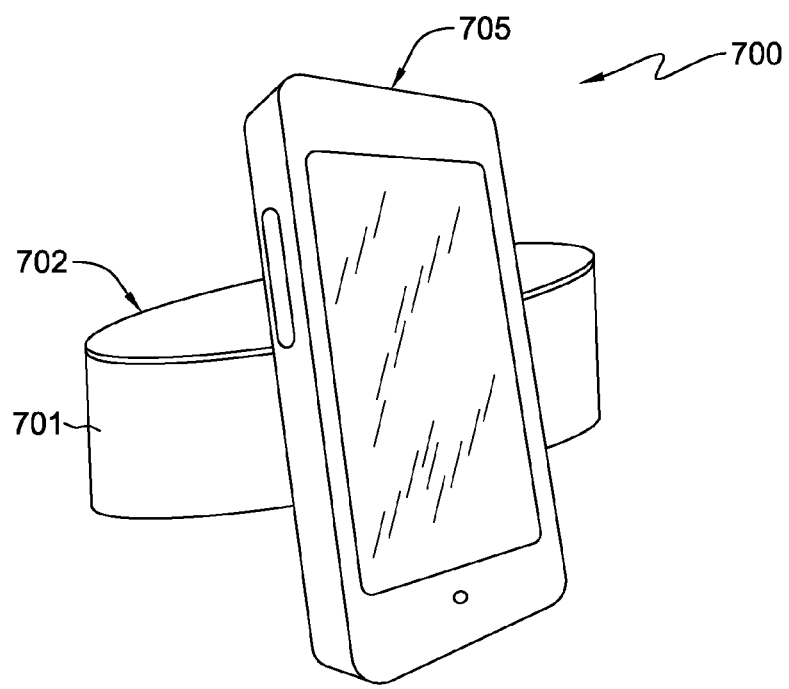
FIG. 7 illustrates a wearable electronic system, in accordance with one or more aspects of the present invention.

FIG. 7 illustrates a wearable electronic system 700 having an electronic device 705 and a support structure 702, in accordance with one or more aspects of the present invention. Electronic device 705 includes one or more electronic components 730, and may be, for example, a wearable media player device. In one example, support structure 702 physically receives and electrically couples to electronic device 705 at an interface.

Support structure 702 also includes an ultra-capacitor structure 701. Ultra-capacitor structure 701 is configured to selectively power one or more electronic components 730 of electronic device 705, when electrically coupled to support structure 502. As illustrated, the support structure is an armband for the electronic device.

Figure 8:
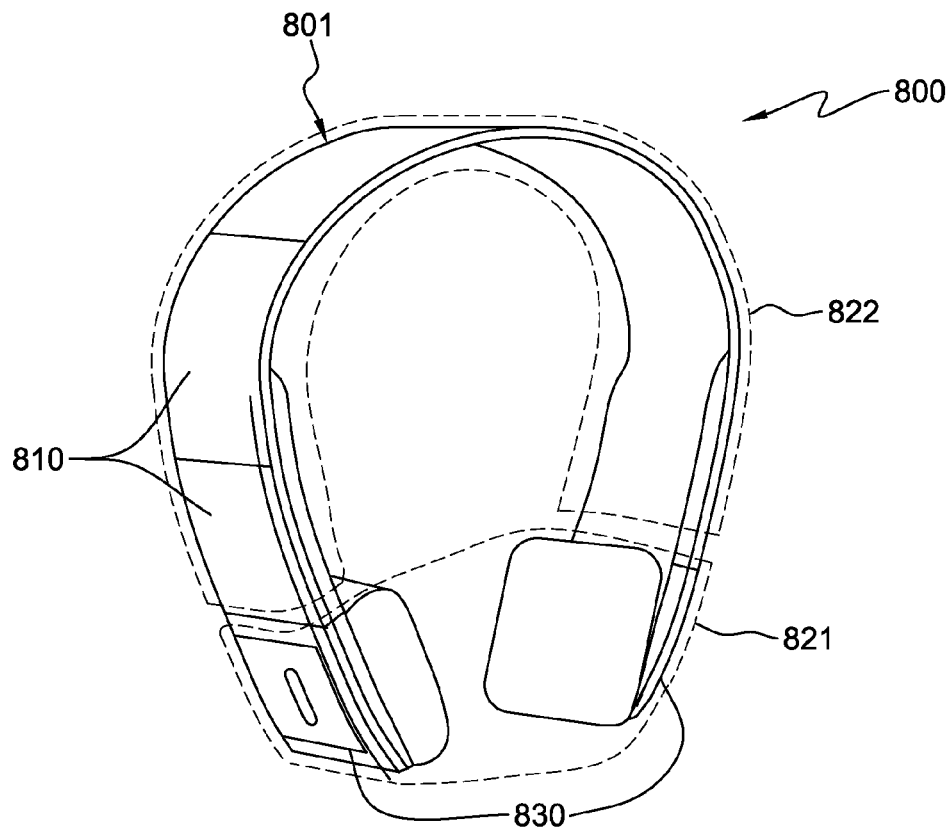
FIG. 8 illustrates an audio headset type electronic assembly, in accordance with one or more aspects of the present invention.

FIG. 8 illustrates an audio headset device type electronic assembly 800, in accordance with one or more aspects of the present invention. Electronic assembly 800 includes a first region 821 with one or more electronic components 830, and a second region 822 with an ultra-capacitor structure 801. First region 821 and second regions 822 of the electronic assembly are spaced apart from one another.

Ultra-capacitor structure 801 may be configured to selectively power one or more electronic components 830 of electronic assembly 800. As depicted, first region 821, including the one or more electronic components 830, is smaller than second region 822. Advantageously, such a configuration allows for a large ultra-capacitor structure to be used along with smaller electronic components.

For example, the ultra-capacitor structure includes or allows for a curved portion of the headband portion of the audio headset device. In such a configuration, the ultra-capacitor structure may have a flexible portion, allowing the headband portion to flex in use. The multi-functional nature of the ultra-capacitor structures of the present disclosure allow for replacing single purpose structural materials, such as a plastic headband portion, with ultra-capacitor structures for powering electronic components.

Figure 9:
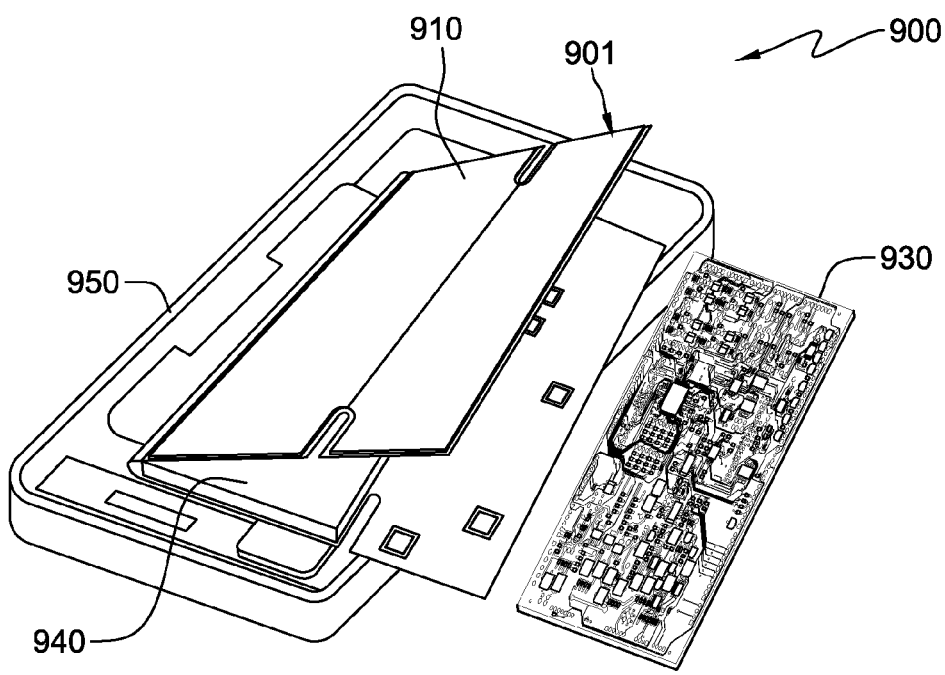
FIG. 9 illustrates a mobile phone type electronic system, in accordance with one or more aspects of the present invention.

FIG. 9 illustrates a mobile phone type electronic system 900, in accordance with one or more aspects of the present invention. As illustrated, electronic system 900 includes an ultra-capacitor structure 901 which is bent around to at least partially house one or more electronic components 930. Ultra-capacitor structure 901 may include one or more ultra-capacitor cells 910 and a battery 940. In one example, the ultra-capacitor structure may be inserted into electronic system 900, and may contact bezel 950, and provide protection from shocks and impacts in the manner described with respect to FIG. 3A.

Figure 10:
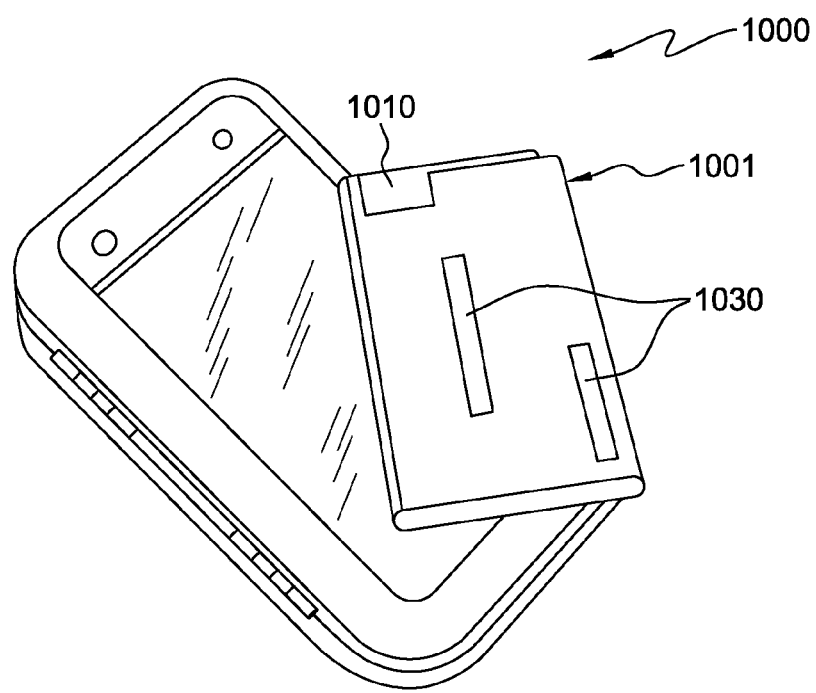
FIG. 10 illustrates a mobile phone type electronic system, in accordance with one or more aspects of the present invention.

FIG. 10 illustrates a mobile phone type electronic system 1000, in accordance with one or more aspects of the present invention. As illustrated, electronic system 1000 includes an ultra-capacitor structure 1001 which includes at least one ultra-capacitor cell 1010 and a battery, the battery being capable of charging the at least one ultra-capacitor structure. In such a case, an ultra-capacitor structure may be integrated with one or more battery cells, and may be used to provide a removable source of power for the electronic system. In one example, the battery may be completely wrapped by the ultra-capacitor structure, to allow for thermal dissipation and electromagnetic shielding thereof.

Figure 11A:
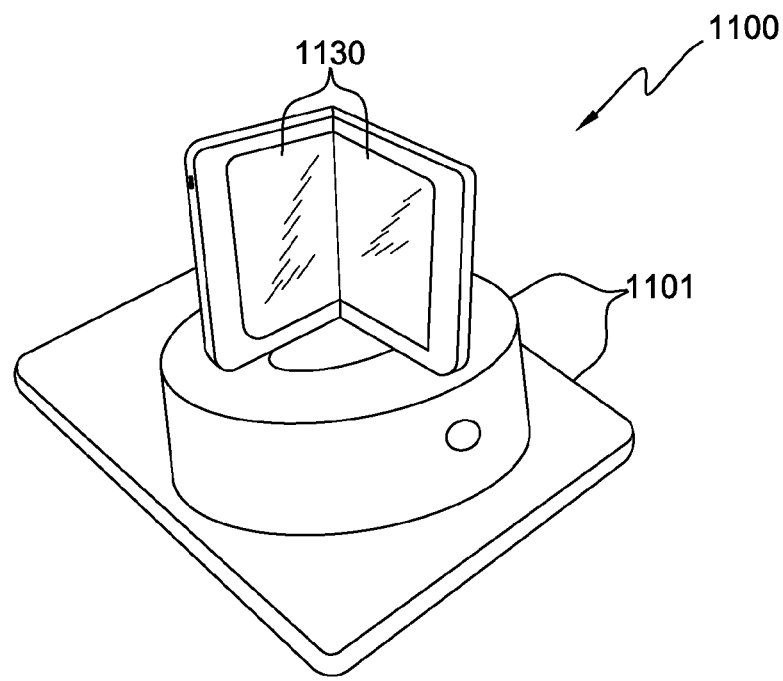
FIGS. 11A & 11B illustrate a foldable electronic system, in accordance with one or more aspects of the present invention.
Figure 11B:
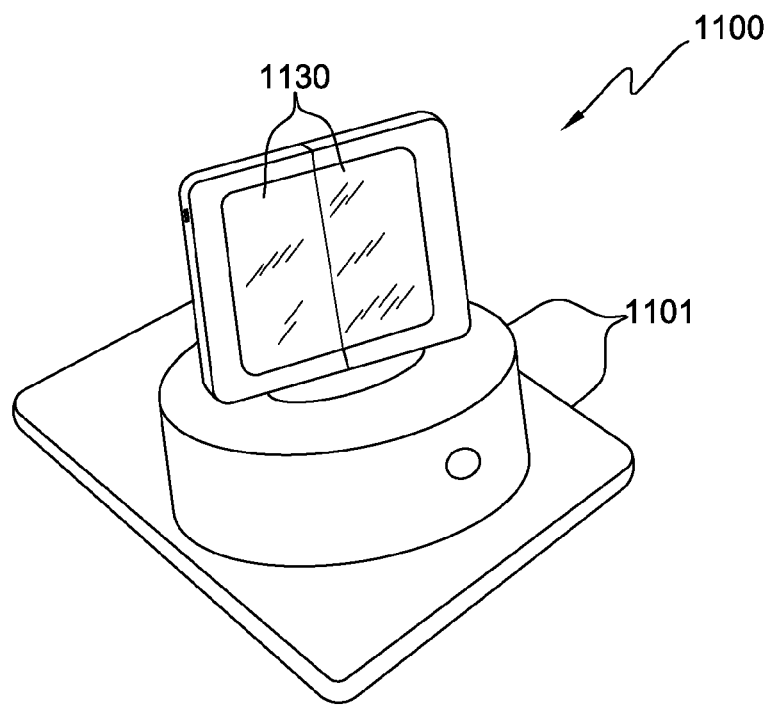

FIGS. 11A & 11B illustrate a foldable electronic system 1100, in which two or more portions of a display may be opened and closed, in accordance with one or more aspects of the present invention. As illustrated, electronic system 1100 includes an ultra-capacitor structure 1101 which is used to both selectively power and implement the folding, due to its flexible construction. Ultra-capacitor structure 1101 structurally supports and at least partially houses one or more electronic components 1130, such as touch screen displays, printed circuit boards, batteries, etc. Folding of electronic system 1100, depicted in FIG. 11B, is achieved due to a bendable portion of the ultra-capacitor structure, as described in detail with respect to FIGS. 2A-2C. As illustrated, electronic components 1130 may be touch screen display portions, which are housed within a flexible structure. The flexible structure surrounding the touch screen display portions include the ultra-capacitor structures. In one embodiment, an ultra-capacitor structure may be configured in the appropriate size and shape as required by the design of the foldable electronic system, for example, by following the topography offset at the edge of multiple printed circuit boards of the electronic system.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
    an ultra-capacitor structure, the ultra-capacitor structure being configured to selectively power and at least partially house one or more electronic components therein; and
    wherein the ultra-capacitor structure comprises at least one bendable portion, the at least one bendable portion facilitating the ultra-capacitor structure bending around to at least partially house the one or more electronic components within the ultra-capacitor structure.

2. The structure of claim 1, further comprising a thermally conductive material, the thermally conductive material facilitating dissipation of heat generated by the one or more electronic components at least partially housed within the ultra-capacitor structure.

3. The structure of claim 2, wherein the thermally conductive material comprises one or more electrodes of the ultra-capacitor structure.

4. The structure of claim 1, further comprising an electrically conductive sheet, the electrically conductive sheet facilitating electromagnetic shielding of the one or more electronic components at least partially housed within the ultra-capacitor structure.

5. The structure of claim 4, wherein the electrically conductive sheet comprises a current collector of the ultra-capacitor structure.

6. The structure of claim 1, wherein the ultra-capacitor structure comprises a shock absorbent material at least partially surrounding the one or more electronic components housed within the ultra-capacitor structure, the shock absorbent material facilitating impact protection thereof.

7. The structure of claim 1, wherein the ultra-capacitor structure comprises multiple layers, and the one or more electronic components are positioned between the multiple layers of the ultra-capacitor structure.

8. The structure of claim 1, further comprising a printed circuit board, the printed circuit board capable of mechanically supporting and electrically connecting the one or more electronic components and the ultra-capacitor structure.

9. The structure of claim 1, further comprising a battery, the battery capable of charging the ultra-capacitor structure thereof.

10. The structure of claim 1, wherein the ultra-capacitor structure comprises multiple ultra-capacitor cells.

11. The structure of claim 1, wherein the ultra-capacitor structure comprises a thermally conductive material, the thermally conductive material facilitating dissipation of heat generated by the one or more electronic components at least partially housed within the ultra-capacitor structure.

12. The structure of claim 1, wherein the ultra-capacitor structure comprises an electrically conductive sheet, the electrically conductive sheet facilitating electromagnetic shielding of the one or more electronic components at least partially housed within the ultra-capacitor structure.

13. The structure of claim 1, wherein the ultra-capacitor structure comprises a shock absorbent material at least partially surrounding the one or more electronic components housed within the ultra-capacitor structure, the shock absorbent material facilitating impact protection thereof.

14. An electronic system comprising:
    one or more electronic components;
    an ultra-capacitor structure, the ultra-capacitor structure being configured to selectively power and at least partially house the one or more electronic components therein; and
    wherein the ultra-capacitor structure comprises at least one bendable portion, the at least one bendable portion facilitating the ultra-capacitor structure bending around to at least partially house the one or more electronic components.

15. The electronic system of claim 14, wherein the ultra-capacitor structure at least partially forms an outer shell of the electronic system.

16. The electronic system of claim 14, wherein the electronic system comprises a mobile device, and the ultra-capacitor structure forms at least a partial outer housing of the mobile device to house the one or more electronic components therein.

17. The electronic system of claim 14, wherein the ultra-capacitor structure comprises a thermally conductive material, the thermally conductive material facilitating dissipation of heat generated by the one or more electronic components at least partially housed within the ultra-capacitor structure.

18. The electronic system of claim 14, wherein the ultra-capacitor structure comprises an electrically conductive sheet, the electrically conductive sheet facilitating electromagnetic shielding of the one or more electronic components at least partially housed within the ultra-capacitor structure.

19. An electronic system comprising:
an electronic device, the electronic device comprising one or more electronic components;
a support structure, the support structure physically receiving and electrically coupling to the electronic device, and comprising an ultra-capacitor structure, wherein the ultra-capacitor structure is configured to selectively power the one or more electronic components of the electronic device when electrically coupled to the support structure; and
wherein a bendable portion of the ultra-capacitor structure facilitates bending of the support structure.

20. An electronic assembly comprising:
a first region, the first region comprising one or more electronic components;
a second region, the second region comprising an ultra-capacitor structure, the ultra-capacitor structure being configured to selectively power the one or more electronic components of the electronic assembly, wherein the first region is spaced apart from the second region; and
wherein the electronic assembly is an audio headset device, and the second region comprises a headband portion thereof, wherein the ultra-capacitor structure comprises a curved portion of the headband portion of the audio headset device.

21. The electronic assembly of claim 20, wherein the first region is smaller than the second region.

* * * * *